United States Patent
Li et al.

(10) Patent No.: US 11,363,731 B1
(45) Date of Patent: Jun. 14, 2022

(54) WRIST-WORN ELECTRONIC DEVICE AND WATERPROOF STRUCTURE

(71) Applicant: GOERTEK INC., Shandong (CN)

(72) Inventors: Xingyu Li, Shandong (CN); Xiangxiang Liu, Shandong (CN)

(73) Assignee: Goertek Inc., Weifang (CN)

( * ) Notice: Subject to any disclaimer, the term of this patent is extended or adjusted under 35 U.S.C. 154(b) by 0 days.

(21) Appl. No.: 17/615,891

(22) PCT Filed: Dec. 27, 2019

(86) PCT No.: PCT/CN2019/129322
§ 371 (c)(1),
(2) Date: Dec. 2, 2021

(87) PCT Pub. No.: WO2021/082260
PCT Pub. Date: May 6, 2021

(30) Foreign Application Priority Data

Oct. 30, 2019 (CN) .......................... 201911045272.2

(51) Int. Cl.
*H05K 5/06* (2006.01)
*H05K 5/00* (2006.01)

(52) U.S. Cl.
CPC .......... *H05K 5/068* (2013.01); *H05K 5/0086* (2013.01)

(58) Field of Classification Search
None
See application file for complete search history.

(56) References Cited

U.S. PATENT DOCUMENTS

| | | | | |
|---|---|---|---|---|
| 6,200,020 B1* | 3/2001 | Rieben | ................... | G04B 37/10 368/290 |
| 8,008,591 B2* | 8/2011 | Shi | ....................... | H01H 13/705 200/341 |
| 8,608,372 B2* | 12/2013 | Koshoji | ................. | G04G 21/00 368/308 |

(Continued)

FOREIGN PATENT DOCUMENTS

| | | |
|---|---|---|
| CN | 201118907 | 9/2008 |
| CN | 201689668 | 12/2010 |

(Continued)

OTHER PUBLICATIONS

International Search Report issued in PCT/CN2019/129322 dated Jul. 29, 2020.

*Primary Examiner* — Xanthia C Cunningham
(74) *Attorney, Agent, or Firm* — Workman Nydegger

(57) ABSTRACT

A waterproof structure includes a shell which is provided with an air hole extending therethrough, a waterproof membrane is provided in a mounting cavity in the shell which abuts the inner side opening of the air hole, and the air hole is internally provided with a ball having waterproof performance and a constraint structure which constrains the ball in a preset range in the air hole; the preset range has a space allowing the ball to freely move; in a gas environment, there is gap between the ball and a boundary face of the present range, so as to allow the communication between the inner side opening and the outer side opening of the air hole; and the ball can press against the constraint structure under the pushing of liquid entering from the outer side opening and seal the inner side opening.

9 Claims, 8 Drawing Sheets

(56) References Cited

U.S. PATENT DOCUMENTS

| | | | | |
|---|---|---|---|---|
| 8,920,022 | B2* | 12/2014 | Ishida | G04B 37/106 368/320 |
| 9,028,134 | B2* | 5/2015 | Koshoji | G04B 37/106 368/290 |
| 9,123,483 | B2* | 9/2015 | Ferri | G04B 37/106 |
| 9,737,123 | B2* | 8/2017 | Wright | A45C 13/008 |
| 9,952,560 | B2* | 4/2018 | Suzuki | G04C 3/001 |
| 11,079,812 | B1* | 8/2021 | Bushnell | G04G 17/02 |
| 2007/0033847 | A1* | 2/2007 | Tanaka | G06F 1/163 40/661.05 |
| 2012/0067711 | A1* | 3/2012 | Yang | H05K 5/069 200/341 |
| 2012/0069501 | A1* | 3/2012 | Lai | H01H 13/86 361/679.01 |
| 2015/0221460 | A1* | 8/2015 | Teplitxky | H01H 13/06 29/622 |
| 2015/0296963 | A1* | 10/2015 | Byun | G04G 17/08 224/191 |
| 2016/0225551 | A1* | 8/2016 | Shedletsky | H01H 13/06 |
| 2016/0239047 | A1* | 8/2016 | Weber | H04M 1/03 |
| 2017/0322660 | A1* | 11/2017 | Kuboyama | G06F 3/045 |
| 2017/0359913 | A1* | 12/2017 | Spencer | G06F 1/163 |
| 2018/0018026 | A1* | 1/2018 | Bushnell | G04C 3/005 |
| 2018/0173279 | A1* | 6/2018 | Park | G06F 1/163 |
| 2018/0210397 | A1* | 7/2018 | Masone | G04B 3/043 |
| 2018/0356861 | A1* | 12/2018 | Ichikawa | G06F 1/3215 |
| 2019/0045642 | A1* | 2/2019 | Prest | H05K 5/03 |

FOREIGN PATENT DOCUMENTS

| | | |
|---|---|---|
| CN | 207235291 | 4/2018 |
| CN | 109343322 | 2/2019 |
| CN | 109901378 | 6/2019 |
| JP | 2018048705 | 3/2018 |

\* cited by examiner

WRIST-WORN ELECTRONIC DEVICE AND WATERPROOF STRUCTURE

The present application is a 371 application of International Patent Application No. PCT/CN2019/129322, filed Dec. 27, 2019, which claims the benefit of and priority to Chinese Patent Application No. 201911045272.2, titled "WRIST-WORN ELECTRONIC DEVICE AND WATERPROOF STRUCTURE", and filed Oct. 30, 2019 with the China National Intellectual Property Administration, which are incorporated herein by reference in their entireties.

FIELD

The preset application relates to the technical field of wearable electronic devices, and in particular to a wrist-worn electronic device and a waterproof structure.

BACKGROUND

An air hole, such as a sound hole or a balance hole, needs to be provided on many electronic products. Further, a waterproof structure needs to be provided at the air hole, so as to provide a waterproof protection for a member in a housing 02.

In a typical waterproof structure, taking a sound hole as an example, a waterproof membrane 05 with waterproof and air-permeable performance is arranged in a mounting chamber 021 of a housing 02, and a sound hole 01 is waterproofed through the waterproof membrane 05, so as to provide a waterproof protection for a member 03 to be waterproofed in the housing 02, as shown in FIG. 1. However, the water pressure that the waterproof membrane 05 can withstand is limited. In a case of high water pressure, the waterproof membrane 05 is easy to fail, which makes the sound hole 01 have a great risk of waterproof failure. Similarly, the balance hole also has the problem of waterproof failure caused by relatively high water pressure.

Therefore, how to improve the waterproof capability of the air hole is a technical problem to be solved by those skilled in the art at present.

SUMMARY

In view of this, an object according to the present application is to provide a waterproof structure, which has an improved waterproof capability. Another object according to the present application is to provide a wrist-worn electronic device including the above waterproof structure, which has a relatively good waterproof capability at an air hole.

In order to achieve the above objects, the following technical solution is provided according to the present application:

a waterproof structure includes a housing with an air hole penetrating through the housing, a waterproof membrane is provided in a mounting chamber which abuts against an inner side port of the air hole, a ball with waterproof performance and a constraint structure for constraining the ball in the air hole in a preset range are provided in the air hole; the ball is movable freely in a space in the preset range; in a gas environment, a gap is present between the ball and a boundary surface of the preset range to communicate the inner side port with an outer side port of the air hole; and the ball is configured to press against the constraint structure tightly if liquid entering from the outer side port and seal the inner side port.

Preferably, the ball is elastic.

Preferably, the ball has water swelling performance; the ball dehydrating into an initial state is movable freely in the preset range, and the gap is present between the ball and the boundary surface of the preset range to communicate the inner side port with the outer side port of the air hole.

Preferably, the constraint structure includes a mounting housing sealingly connected to the air hole, the ball is arranged in an inner chamber of the mounting housing, and at least part of an inner wall of the mounting housing defines the preset range; an inner side through hole and an outer side through hole penetrate through the mounting housing, and in the gas environment, the inner side port is communicated with the outer side port through the inner side through hole, the gap between the ball and the inner wall of the mounting housing, and the outer side through hole in a listed sequence.

Preferably, a part, close to the inner side through hole, of the inner wall of the mounting housing is a spherical surface with the same radian with the ball.

Preferably, the mounting housing includes a bottom seat 32 and a top cover 31 connected to the bottom seat 32, a space between the bottom seat and the top cover forms the inner chamber, the bottom seat includes a supporting ring extending into the top cover, and the supporting ring cooperates with the top cover to define the preset range.

Preferably, the supporting ring is sealingly connected to the top cover through a waterproof rubber ring.

Preferably, the air hole includes a main hole and a side hole with an angle greater than 0 degree with the main hole, and a free end port of the side hole is the outer side port, a free end port of the main hole is the inner side port, and the mounting housing is arranged in the main hole.

Preferably, the outer side through hole is arranged directly opposite to the side hole, an edge, abutting against an inner wall of the main hole, of the outer side through hole is arranged outside a port at a connecting end of the side hole and the main hole.

A wrist-worn electronic device, which includes the waterproof structure according to any one of the above.

The waterproof structure provided according to the present application includes the housing with the air hole penetrated on the housing, and the ball with waterproof performance and the constraint structure for constraining the ball in the preset range of the air hole are provided in the air hole; in the gas environment, the ball can move freely in the preset range, the gap is present between the ball and the boundary surface of the preset range to communicate the inner side port with the outer side port of the air hole; in the liquid environment, the ball can press against the constraint structure tightly and seal the inner side port under the pushing of the liquid entering from the outer side port.

When in the air, the ball is in a free state without being pressed and can move arbitrarily in the preset range. A passage is present between the inner side port and the outer side port of the air hole for gas to circulate between an external environment and the mounting chamber of the housing. As long as the passage allows a little air to pass through, the mounting chamber can perform a corresponding function through the passage. After water enters, it enters the air hole from the outer side port and flows towards the inner side port. The ball moves towards the inner side port and presses against the constraint structure tightly under the impact of the water, so as to seal the inner side port. The passage between the inner side port and the outer side port is blocked by the ball, and water cannot flow into the mounting chamber through the inner side port. In addition, the waterproof membrane can be used as another waterproof barrier to ensure a reliable and compressive waterproof for the member to be waterproofed.

In this waterproof structure, after liquid enters the air hole, the ball is impacted and moves towards the inner side port and presses against the constraint structure tightly, so as to seal the inner side port. As the water pressure increases, the pressure on the ball may increase accordingly and can press against the constraint structure more tightly, so as to completely close the air hole in the liquid environment, which can prevent the waterproof membrane from directly bearing relatively high water pressure, can effectively protect the waterproof membrane, and has a strong waterproof capability. The waterproof capability can reach a waterproof standard of 5 atm or even 10 atm.

A wrist-worn electronic device provided according to the present application includes the above waterproof structure, which has a relatively good waterproof capability at an air hole.

BRIEF DESCRIPTION OF THE DRAWINGS

For more clearly illustrating embodiments of the present application or the technical solutions in the conventional technology, drawings to be used in the description of the embodiments or the conventional technology will be briefly described hereinafter. Apparently, the drawings in the following description are only some embodiments of the present application. For those skilled in the art, other drawings may be obtained based on the provided drawings without any creative work.

Figure 1:
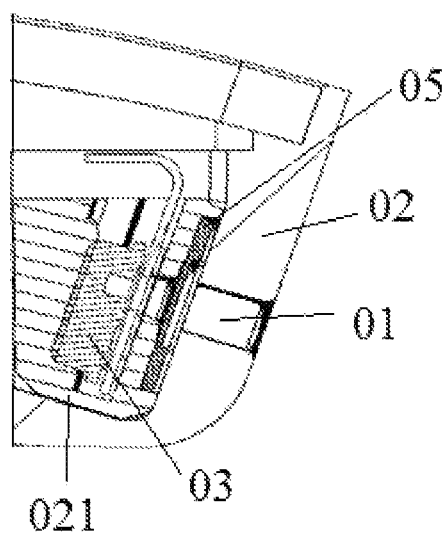
FIG. 1 is a sectional view of a waterproof structure in the conventional technology.
Figure 2:
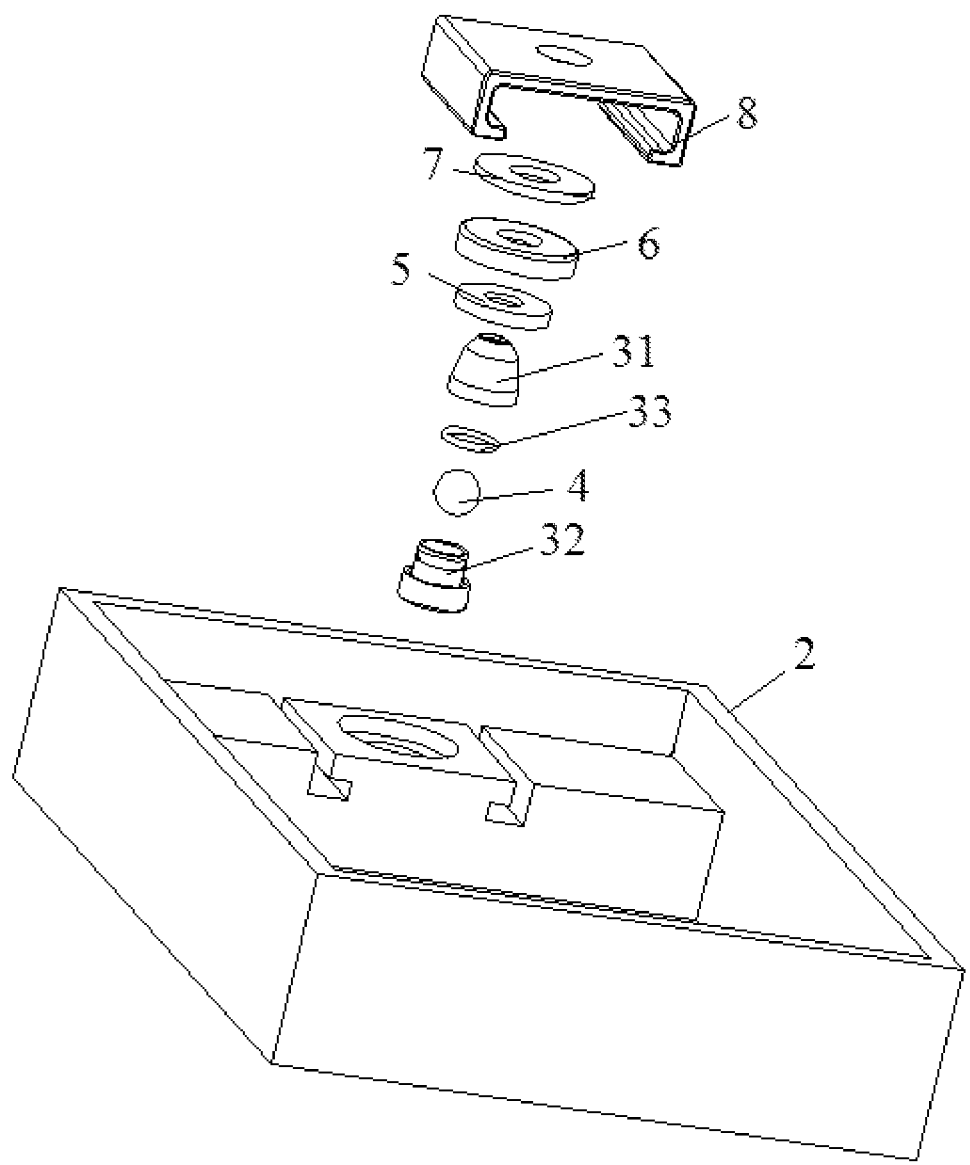
FIG. 2 is an exploded view of the waterproof structure provided according to the present application.

The reference numerals are as follows:
01 sound hole,
02 housing,
021 mounting chamber,
03 member to be waterproofed,
05 waterproof membrane;
1 air hole,
11 inner side port,
12 outer side port,
13 main hole,
2 housing,
21 mounting chamber,
3 mounting housing,
31 top cover,
32 bottom seat,
321 supporting ring,
33 waterproof rubber ring,
34 inner side through hole,
35 outer side through hole,
4 ball,
5 waterproof membrane,
6 waterproof membrane bracket,
7 pressing foam,
8 locking steel sheet.

DETAILED DESCRIPTION OF THE EMBODIMENTS

The technical solutions according to the embodiments of the present application will be described clearly and completely as follows in conjunction with the drawings in the embodiments of the present application. It is apparent that the described embodiments are only a part of the embodiments according to the present application, rather than all of the embodiments. Based on the embodiments of the present application, all other obtained without creative efforts by those of the ordinary skill in the art shall fall within the protection scope of the present application.

An object according to the present application is to provide a waterproof structure, which has improved the waterproof capability. Another object according to the present application is to provide a wrist-worn electronic device including the above waterproof structure, which has relatively good waterproof capability at an air hole.

In the description of the present application, it should be noted that the orientation or positional relationship indicated by the terms "inner", "outer", etc., is based on the orientation or positional relationship shown in the drawings, and is merely for the convenience of describing the present application or simplifying the description, and does not indicate or imply that the device or element referred to must have a specific orientation or be constructed or operated in a specific orientation, and therefore cannot be understood as a limitation of the present application.

The waterproof structure provided according to the present application may be applied to a sound hole and an air hole (or balance hole), and the sound hole may be a microphone hole or a horn hole, and this embodiment is described by taking the air hole as an example. The waterproof structure includes a housing 2 with an air hole 1 penetrating through the housing 2. A constraint structure is provided in the air hole 1, and the constraint structure is configured to constrain a ball 4 in the air hole 1 in a preset range, which prevents the ball 4 from being out of the vent 1, and the ball 4 is movable freely in a space in the preset range. Besides, the ball has a waterproof function, and is preferably elastic, and more specifically, it may be a plastic ball such as a silica gel ball or a soft rubber ball.

Figure 7:
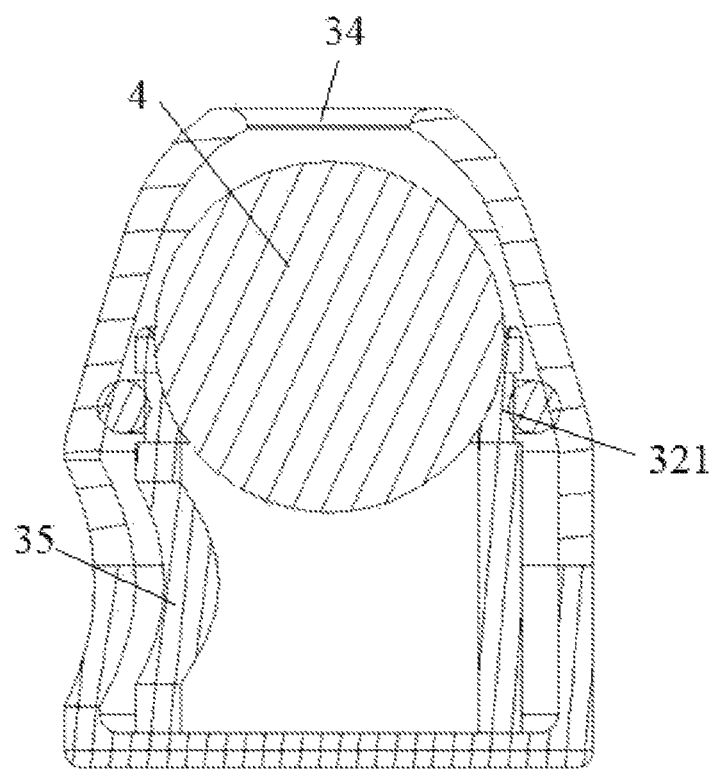
FIG. 7 is a sectional view of the waterproof structure provided according to the present application in a gas environment.

In a gas environment, as shown in FIG. 7, the ball 4 can move freely in the preset range, and a gap is present between the ball 4 and a boundary surface of the preset range to communicate an inner side port 11 of the air hole 1 with an outer side port 12 of the air hole 1. In addition, the air hole 1 communicates an outer side of the housing 2 and a mounting chamber 21 inside the housing 2, so that the air hole 1 can perform corresponding operation through the gap.

Figure 8:
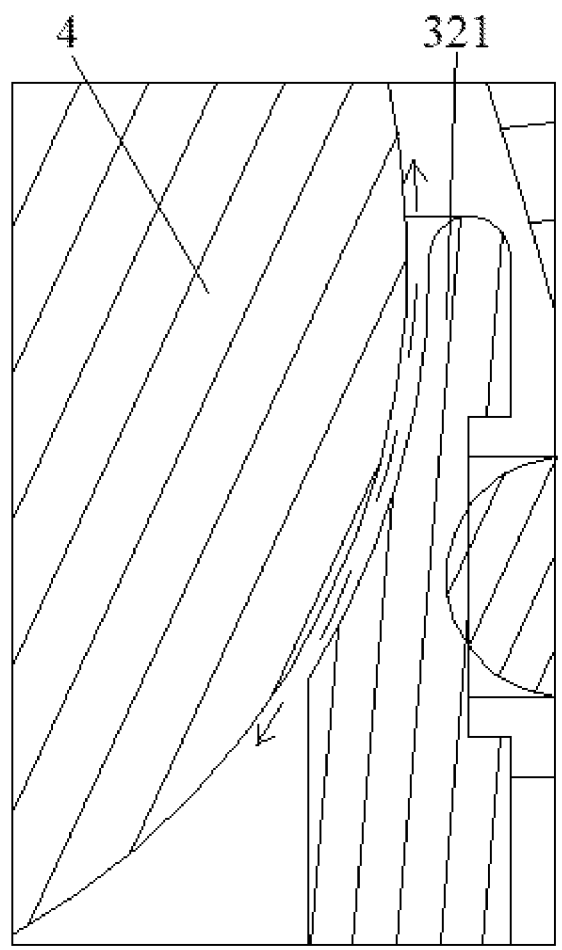
FIG. 8 is an enlarged view of FIG. 7 at location A, and the dashed line indicates a gas flow passage.

Specifically, in the gas environment, the ball 4 may be at any position in the air hole 1 in the preset range according to a position and posture of the housing 2 in a space. When the ball 4 is at different positions in the preset range, the gap may be formed between the ball 4 and the boundary surface of the preset range, and a position of the gap is generally different. It should be noted that, even if the ball 4 covers an end of the constraint structure in an extending direction of the air hole 1, the ball 4 may not seal the inner side port 11 or the outer side port 12, since there is no force in the air hole 1 pressing the ball 4 against the constraint structure tightly in the gas environment. Specifically, as shown in FIG. 8, the ball 4 does not abut against the boundary surface of the preset range tightly, and at least a small gap extending from the inner side port 11 to the outer side port 12 is present between the ball 4 and the boundary surface of the preset range, and the existence of the small gap allows the air hole 1 to ventilate. In addition, since the ball 4 can move freely in the preset range, the position of the ball 4 is changed by just shaking the waterproof structure slightly if the air-permeable effect is required to be adjusted.

Figure 9:
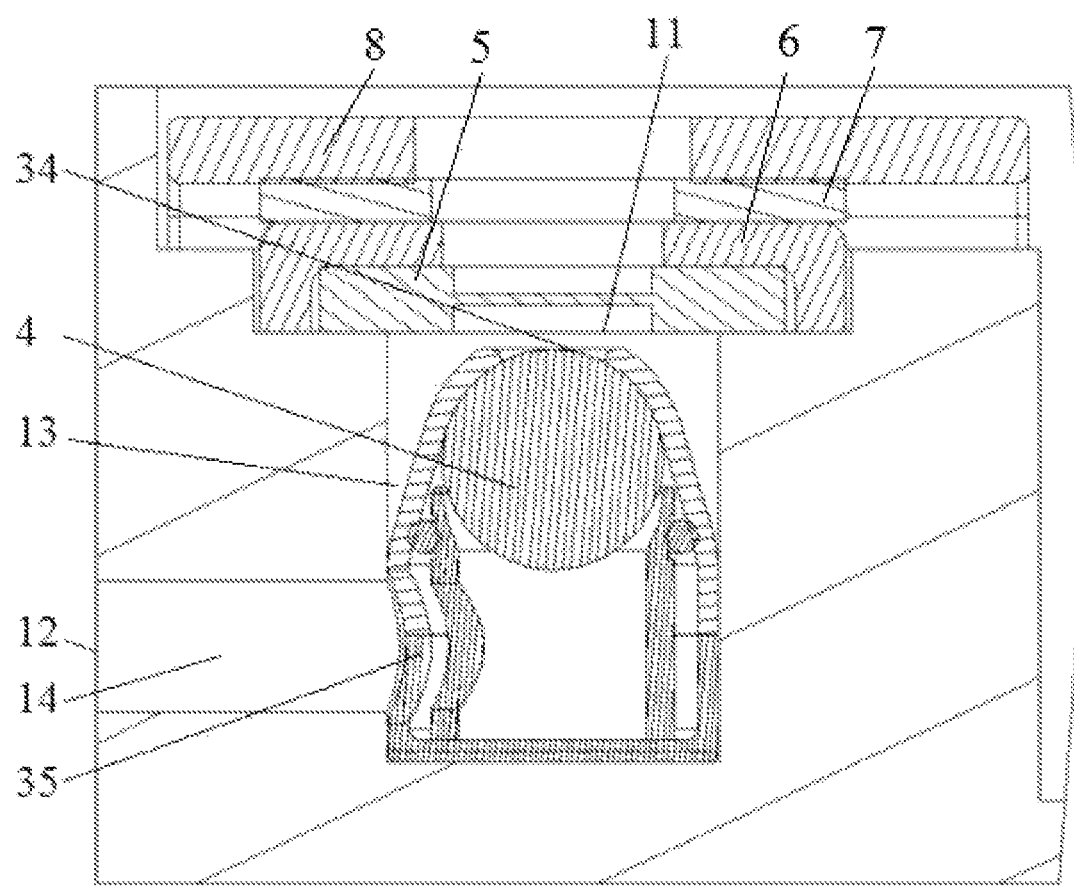
FIG. 9 is a sectional view of the waterproof structure provided according to the present application in a liquid environment.

In a liquid environment, the liquid enters the air hole 1 from the outer side port 12 of the air hole 1, as shown in FIG. 9, the ball 4 can press against the constraint structure tightly and seal the inner side port 11 under the pushing of the liquid, and when the ball 4 presses against the constraint structure tightly, the ball 4 and the inner side port 11 can be slightly deformed to ensure a sealing fit. Since the inner side port 11 is sealed, a passage between the inner side port 11 and the outer side port 12 is blocked, and the liquid cannot flow out of the air hole 1 through the inner side port 11. Besides, the ball 4 is generally small and light, and the space in the air hole 1 for the ball 4 to move is small, so that when the liquid enters the air hole 1, the ball 4 is impacted and blocks the inner side port 11 immediately.

The elastic ball 4 can more tightly abut against the constraint structure through elastic deformation. However, it should be ensured that in a case that the ball 4 is deformed to a smallest volume, the constraint structure can still constrain the ball 4 inside the air hole 1, and the elasticity of the ball 4 is preferably set to be relatively small.

In addition, a waterproof membrane 5 is provided in the mounting chamber 21, which abuts against the inner side port 11, of the housing 2. As shown in FIG. 7, a waterproof membrane bracket 6 is provided in the mounting chamber 21 of the housing 2, and the waterproof membrane 5 is arranged on the waterproof membrane bracket 6. The waterproof membrane 5 is waterproof and air-permeable, so as to make the mounting chamber 21 be waterproof and air-permeable. In order to further ensure the waterproof effect, a pressing foam 7 and a locking steel sheet 8 for locking the pressing foam 7 to the waterproof membrane bracket 6 are provided in the mounting chamber 21. In addition, in the embodiment in which the waterproof structure is applied to the sound hole, an MIC member to be waterproofed may be provided in the mounting chamber 21.

The greater the water pressure is, the more tightly the ball 4 can press against the constraint structure, and the better the waterproof performance is. In the liquid environment, in a case that the water pressure on the ball 4 is relatively small, the waterproof membrane 5 can be used for reliable waterproof protection even if a small amount of water enters the mounting chamber 21 before the ball 4 completely seals the inner side port 11. In addition, after the waterproof structure returns to the gas environment, the water entering the mounting chamber 21 can flow out through the gap between the ball 4 and the boundary surface of the preset range. In a case of relatively high water pressure, the water pressure is mainly borne by the ball 4, and the waterproof membrane 5 may not be subjected to the high water pressure and has no risk of failure. Even if the waterproof membrane 5 has a poor waterproof capability, it can also have a good waterproof effect by cooperating with the ball 4.

In a case of applying to a balance hole in a wrist-worn electronic device, the inner side port 11 thereof abuts against the mounting chamber 21 of the housing 2, and the outer side port 12 is in contact with the outside air. As shown in FIG. 7, when in the air, the ball 4 is in a free state without being pressed and can move arbitrarily in the preset range. A passage is present between the inner side port 11 and the outer side port 12 of the air hole 1 for gas to circulate between an external environment and the mounting chamber 21 of the housing. As long as the passage allows a little air to pass through, the mounting chamber 21 can be communicated with the outside air through the passage. As shown in FIG. 9, after water enters, the water enters the air hole 1 from the outer side port 12 and flows towards the inner side port 11. The ball 4 moves towards the inner side port 11 and presses against the constraint structure tightly under the impact of the water, so as to seal the inner side port 11. The passage between the inner side port 11 and the outer side port 12 is blocked by the ball 4, and water cannot flow into the mounting chamber 21 through the inner side port 11, and the waterproof membrane 5 can be used as another waterproof barrier. Besides, in other embodiments, the waterproof structure may also be applied to an electronic product such as a mobile phone and an audio. Accordingly, the air hole 1 may be a microphone hole, a balance hole, a horn hole, and other structure that need to be waterproofed.

In the waterproof structure provided according to the present application, after the liquid enters the air hole 1, the ball 4 is impacted and moves towards the inner side port 11 and presses against the constraint structure tightly, so as to seal the inner side port 11. As the water pressure increases, the pressure on the ball 4 may increase accordingly and can press against the constraint structure more tightly, so as to completely close the air hole in the liquid environment, which can prevent the waterproof membrane 5 from directly bearing relatively high water pressure, effectively protect the waterproof membrane 5, and has a strong waterproof capability. The waterproof capability can reach a waterproof standard of 5 atm or even 10 atm, which is especially suitable for a device that needs to work in the liquid environment with a high water pressure.

Figure 3:
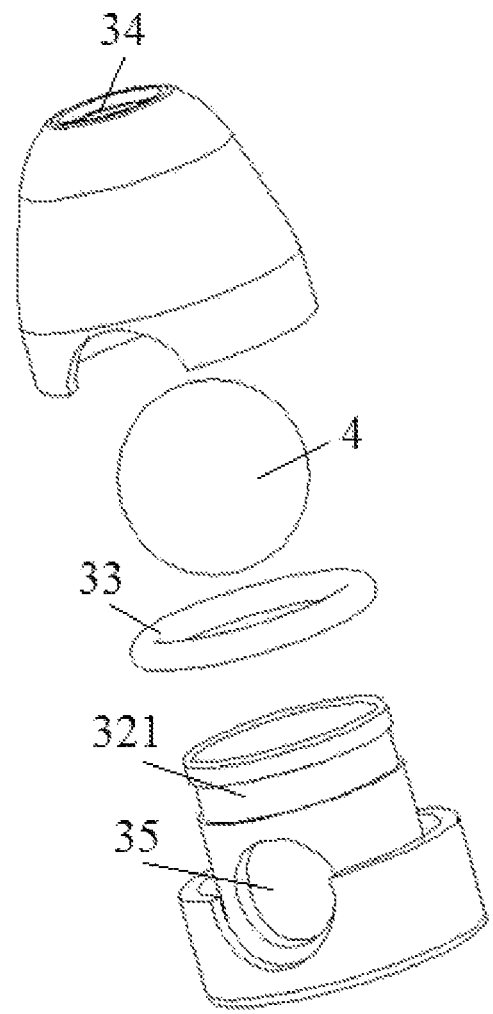
FIG. 3 is an exploded view of an internal member of an air hole in the waterproof structure provided according to the present application.
Figure 4:
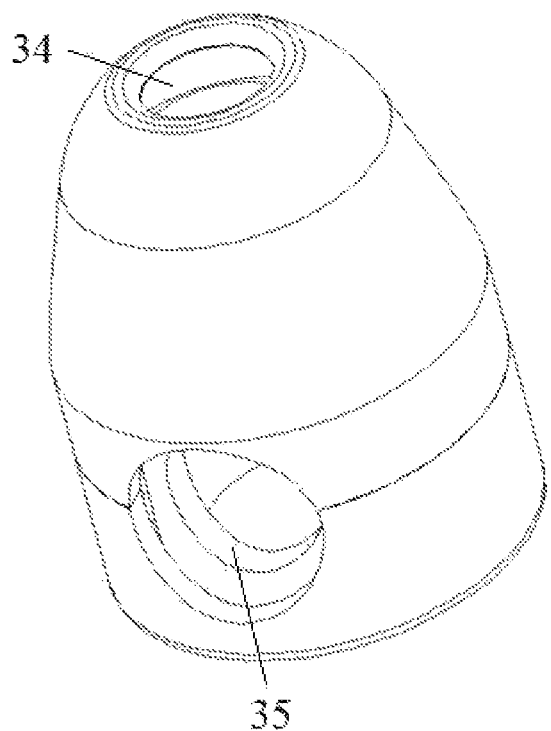
FIG. 4 is a structural diagram of the internal member of the air hole in the waterproof structure provided according to the present application.
Figure 5:
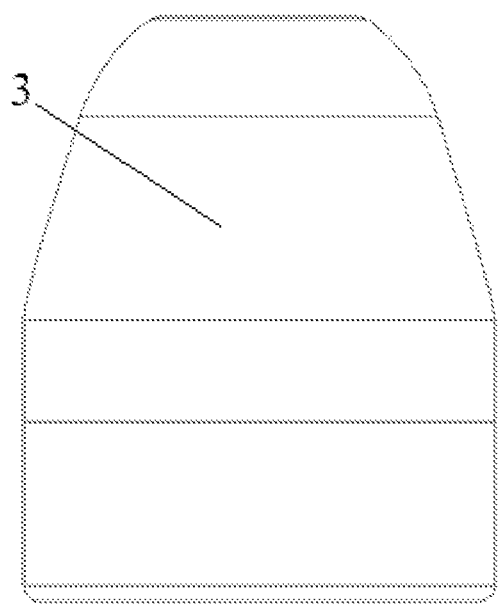
FIG. 5 is a side view of the internal member of the air hole in the waterproof structure provided according to the present application.

Further, referring to FIG. 3, the constraint structure includes a mounting housing 3 sealingly connected to the air hole 1, and no passage is present between an outer wall of the mounting housing 3 and a hole wall of the air hole 1 for the fluid to pass. Optionally, the mounting housing 3 is sealingly connected to the air hole 1 by glue dispensing.

The ball 4 is arranged in an inner chamber of the mounting housing 3, and at least part of the inner wall of the mounting housing 3 defines the preset range. As shown in the orientation in FIG. 7, the inner chamber of the mounting housing 3 is much larger than the ball 4, the preset range is defined by an upper half portion of the inner wall of the mounting housing 3, and the ball 4 is defined to move in a small range of an upper half portion of the inner chamber of the mounting housing 3, and cannot move into a lower half portion of the inner chamber of the mounting housing 3. Besides, in a case that a volume of the inner chamber of the mounting housing 3 is substantially the same as a volume of the ball 4, the ball 4 can move in the entire inner chamber of the mounting housing 3, and the preset range is defined by the entire inner wall of the mounting housing 3.

An inner side through hole 34 and an outer side through hole 35 penetrate through the mounting housing 3, and referring to FIG. 7, in the gas environment, the inner side port 11 is communicated with the outer side port 12 through the inner side through hole 34, the gap between the ball 4 and the inner wall of the mounting housing 3, and the outer side through hole 35 in a listed sequence. In the liquid environment, the ball 4 presses against the inner side through hole 34 tightly, and since the mounting housing 3 and the air hole 1 are sealed, the inner side port 11 of the housing 2 is sealed by the sealing of the inner side through hole 34.

Through the arrangement of the mounting housing 3, during the assembly, the ball 4 may be mounted in the mounting housing 3 first, and then the mounting housing 3 is mounted in the air hole 1, which facilitates the delineation of the preset range and facilitates the mounting of the ball 4 in the air hole 1.

Further, referring to FIG. 9, a part of the inner wall, close to the inner side through hole 34, of the mounting housing 3 is a spherical surface with the same radian with the ball 4, and a specific proportion of the spherical surface to a complete spherical surface may be set as required. In addition, an external shape of the mounting housing 3 is not limited as long as it is easy to process and assemble.

In the liquid environment, as shown in FIG. 9, because of the profiling design between the inner wall of the mounting housing 3 and the ball 4, the fit degree of the ball 4 and the mounting housing 3 has been improved. After the ball 4 is pressed against the mounting housing 3 to seal the inner side through hole 34, the ball 4 has no space to move in a direction perpendicular to the water pressure, and may not move in other directions away from the inner side through hole 34 under the action of the water pressure, which can further improve the waterproof effect.

Figure 6:
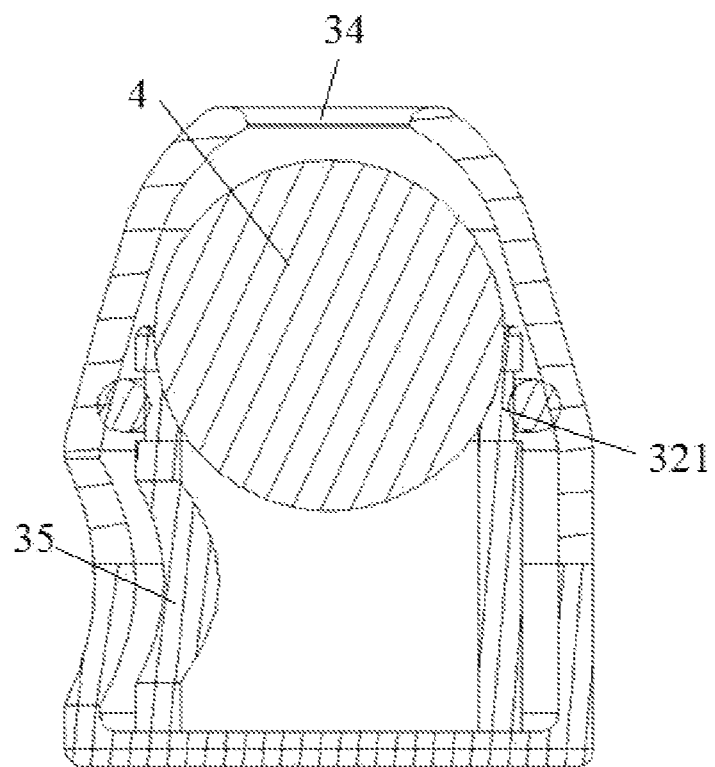
FIG. 6 is a sectional view of the internal member of the air hole in the waterproof structure provided according to the present application.

Further, referring to FIGS. 3 and 6, the mounting housing 3 includes a bottom seat 32 and a top cover 31 connected to the bottom seat 32, and a space between the bottom seat 32 and the top cover 31 forms the inner chamber. Optionally, the top cover 31 is fixedly connected with the bottom seat 32 by a buckle, glue dispensing, ultrasound and the like. Besides, the bottom seat 32 includes a supporting ring 321 extending into the top cover 31, and the supporting ring 321 cooperates with the top cover 31 to define the preset range. The arrangement of the supporting ring 321 can realize the setting of the preset range more conveniently.

Further, referring to FIG. 6, the supporting ring 321 is sealingly connected to the top cover 31 through a waterproof rubber ring 33. The top cover 31 and the bottom seat 32 are waterproofed by squeezing the waterproof rubber ring 33, so as to limit a position of water between top cover 31 and the bottom seat 32.

Further, referring to FIG. 7, the air hole 1 includes a main hole 13 and a side hole 14 with an angle greater than 0 degree with the main hole 13, and a free end port of the side hole 14 is the outer side port 12, a free end port of the main hole 13 is the inner side port 11, and the mounting housing 3 is arranged in the main hole 13. The angle of the air hole 1 can increase the resistance to water, and a waterproof barrier is formed by the angle, which can improve the waterproof capability. In this embodiment, the angle between the main hole 13 and the side hole 14 is set to 90 degrees. In other embodiments, the angle may be set to 60 degrees, 80 degrees or other angle values.

Figure 10:
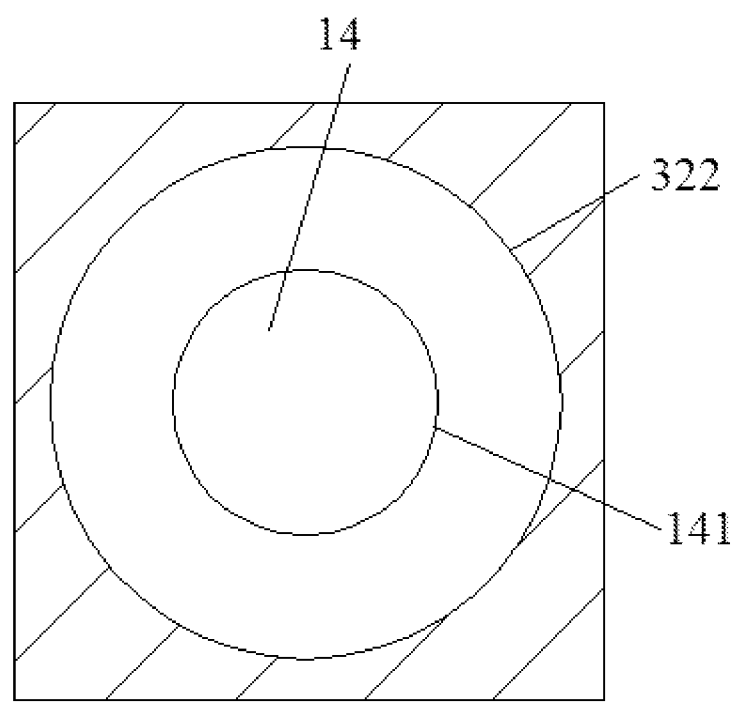
FIG. 10 is a positional relationship diagram of a side hole and an outer side through hole in the waterproof structure provided according to the present application.

Further, as shown in FIGS. 9 and 10, the outer side through hole 35 is arranged directly opposite to the side hole 14, an edge 322, abutting against an inner wall of the main hole 13, of the outer side through hole 35 is arranged outside a port 141 at a connecting end of the side hole 14 and the main hole 13.

Due to the positional relationship between the outer side through hole 35 and the side hole 14, after water enters the side hole 14, it may directly enters the mounting housing 3 through the outer side through hole 35 without impacting the outer wall of the mounting housing 3 and affecting the sealing between the mounting housing 3 and the air hole 1.

The working principle of the waterproof structure provided in this embodiment is as follows:

in normal use, the waterproof structure is in the air, the gap is present between the ball 4 and the mounting housing 3, the air hole 1 is normally open and can be ventilated to achieve the function such as balancing the air pressure; the waterproof structure enters a waterproof state after it contacts with water, and the ball 4 moves towards the inner side port 11 of the housing 2 under the action of the water pressure, and the ball 4 may press against the inner side through hole 34 of the mounting housing 3 tightly so as to seal the inner side port 11.

Apparently, the ball 4 is not limited to being waterproof or elastic. In another embodiment, the ball 4 has water swelling performance. The ball 4 in an initial state of dehydration can move freely in the preset range, and the gap is present between the ball 4 in the initial state and the boundary surface of the preset range to communicate the inner side port 11 with the outer side port 12 of the air hole 1, so as to ensure the air-permeable function of the air hole 1 not to be affected in the case that the ball 4 is in a minimum volume state.

Specifically, the ball 4 is made of a water-absorbing polymer (Absorbent Polymer, for example, sodium polyacrylate or polyacrylate), which swells after absorbing water, and continues to absorb the surrounding water before being saturated. In addition, the water-absorbing swelling member may also be made of a deformable material, which can be deformed after being stressed. Alternatively, the ball 4 may be made of a rubber material similar to a water stop strip, which generally swells by 2 or 3 times when it contacts with water and can recover quickly after dehydration. The ball 4 may specifically be dehydrated by natural evaporation or heating of other members in the device, and the volume may be reduced accordingly during dehydration.

After liquid enters the air hole 1, the ball 4 may not only be pushed towards the inner side port 11 by the water, but also may absorb water and swell when it contacts with water. In a case that the water pressure increases, the ball 4 can press against the constraint structure more tightly, the swelling degree has an increasing tendency, and the waterproof capability is correspondingly higher, so as to further improve the sealing effect, and seal the inner side port 11 more reliably.

Apparently, the constraint structure is not limited to being provided as the mounting housing 3 provided in the above embodiments. In another embodiment, the constraint structure includes an inner side annular plate and an outer side annular plate, the inner side annular plate is sealingly fixed on the inner side port 11, the outer side annular plate is fixed on the outer side port 12, and the inner side annular plate and the outer side annular plate can prevent the ball 4 from being out of the air hole 1. Besides, the preset range is a space between the inner side annular plate and the outer side annular plate of the air hole 1. In the gas environment, the gap is present between the ball 4 and the hole wall of the air hole 1 to communicate the inner side port 11 with the outer side port 12 of the air hole 1. In the liquid environment, the ball presses against a middle through hole of the inner side annular plate tightly so as to seal the inner side port 11.

In addition to the above waterproof structure, a wrist-worn electronic device is provided according to the present application. The wrist-worn electronic device includes a waterproof structure, which may specifically be the waterproof structure provided according to any one of the above embodiments, and the beneficial effects may be referred to the above embodiments accordingly. More specifically, the waterproof structure may be applied to the sound hole and the air hole in the wrist-worn electronic device, and the structure of other parts of the wrist-worn electronic device may be referred to the conventional technology, which will not be repeated here.

The above embodiments are described in a progressive manner. Each of the embodiments is mainly focused on describing its differences from other embodiments, and reference may be made among these embodiments with respect to the same or similar parts.

The above embodiments are described in a parallel manner or a progressive manner. Each of the embodiments is mainly focused on describing its differences from other embodiments, and reference may be made among these embodiments with respect to the same or similar parts. For the device provided in the embodiments, since it corresponds to the method provided in the embodiments, the description is relatively simple, and the relevant details can be seen in the description of the method section.

It should be understood for those skilled in the art that, the units and algorithm steps of the examples described in the embodiments provided herein can be implemented by electronic hardware, computer software, or a combination of the two. In order to clearly illustrate the interchangeability of hardware and software, the composition and algorithm steps of the examples have been described generally according to the functions in the above description. Whether these functions are executed by hardware or software depends on the specific application and design constraint conditions of the technical solution. Professionals and technicians can use different methods for each specific application to implement the described functions, and such implementation should not be considered beyond the scope of the present application.

The steps of the method or the algorithm described in the embodiments provided herein can be directly implemented by hardware, a software module executed by a processor, or a combination of the two. The software module may be placed in a random access memory (RAM), an internal memory, a read-only memory (ROM), an electrically programmable ROM, an electrically erasable programmable ROM, a register, a hard disk, a removable disk, a CD-ROM or any other form of storage medium known in the technical field.

It should be noted that, the relational terms such as first and second herein are merely used to distinguish one entity or operation from another entity or operation, and do not necessarily require or imply any such actual relationship or sequence between these entities or operations. Moreover, the terms "include", "comprise" or any other variation is intended cover non-exclusive inclusion, so that a process, method, article or device including a series of elements not only includes those elements, but also includes other elements that are not explicitly listed, or elements inherent in such process, method, article or device. Without further restrictions, the element defined by the sentence "include a" does not exclude the existence of other identical elements in the process, method, article or device including the element.

The invention claimed is:

1. A waterproof structure, comprising a housing with an air hole penetrating through the housing, wherein a waterproof membrane is provided in a mounting chamber, which abuts against an inner side port of the air hole, of the housing, a sphere with waterproof performance and a constraint structure for constraining the sphere in the air hole in a preset range are provided in the air hole; the sphere is movable freely in a space in the preset range; in a gas environment, a gap is present between the sphere and a boundary surface of the preset range to communicate the inner side port with an outer side port of the air hole; and the sphere is configured to press against the constraint structure tightly and seal the inner side port under the pushing of liquid entering from the outer side port, wherein the constraint structure comprises a mounting housing sealingly connected to the air hole, the sphere is arranged in an inner chamber of the mounting housing, and at least part of an inner wall of the mounting housing defines the preset range; an inner side through hole and an outer side through hole penetrate through the mounting housing, and in the gas environment, the inner side port is communicated with the outer side port through the inner side through hole, the gap between the sphere and the inner wall of the mounting housing, and the outer side through hole in a listed sequence.

2. The waterproof structure according to claim 1, wherein the sphere is elastic.

3. The waterproof structure according to claim 1, wherein the sphere has water swelling performance; the sphere dehydrating into an initial state is movable freely in the preset range, and the gap is present between the sphere and the boundary surface of the preset range to communicate the inner side port with the outer side port of the air hole.

4. The waterproof structure according to claim 1, wherein a part, close to the inner side through hole, of the inner wall of the mounting housing is a spherical surface with the same radian with the sphere.

5. The waterproof structure according to 1, wherein the mounting housing comprises a bottom seat and a top cover connected to the bottom seat, a space between the bottom seat and the top cover forms the inner chamber, the bottom seat comprises a supporting ring extending into the top cover, and the supporting ring cooperates with the top cover to define the preset range.

6. The waterproof structure according to claim 5, wherein the supporting ring is sealingly connected to the top cover through a waterproof rubber ring.

7. The waterproof structure according to 1, wherein the air hole comprises a main hole and a side hole with an angle greater than 0 degree with the main hole, and a free end port of the side hole is the outer side port, a free end port of the main hole is the inner side port, and the mounting housing is arranged in the main hole.

8. The waterproof structure according to claim 7, wherein the outer side through hole is arranged directly opposite to the side hole, an edge, abutting against an inner wall of the main hole, of the outer side through hole is arranged outside a port at a connecting end of the side hole and the main hole.

9. A wrist-worn electronic device, comprising the waterproof structure according to claim 1.

* * * * *